(12) United States Patent
Boyle et al.

(10) Patent No.: US 6,909,911 B2
(45) Date of Patent: Jun. 21, 2005

(54) WIRELESS TERMINAL

(75) Inventors: Kevin R. Boyle, Horsham (GB); Peter J. Massey, Horley (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 482 days.

(21) Appl. No.: 10/218,215

(22) Filed: Aug. 13, 2002

(65) Prior Publication Data

US 2003/0050094 A1 Mar. 13, 2003

(30) Foreign Application Priority Data

Sep. 13, 2001 (GB) ................................ 0122226

(51) Int. Cl.⁷ .......................... H04M 1/00; H04B 1/10; H01Q 1/24; H04Q 1/52
(52) U.S. Cl. ................... 455/575.5; 455/300; 455/301; 343/841; 343/702
(58) Field of Search .............................. 455/575.5, 300, 455/301, 575.7, 90.1, 90.3, 117; 343/841, 851, 702, 700 MS, 846, 848, 824

(56) References Cited

U.S. PATENT DOCUMENTS

| | | | |
|---|---|---|---|
| 5,764,190 A | 6/1998 | Murch et al. | 343/702 |
| 6,198,943 B1 * | 3/2001 | Sadler et al. | 455/553.1 |
| 6,333,716 B1 * | 12/2001 | Pontoppidan | 343/702 |
| 6,356,773 B1 * | 3/2002 | Rinot | 455/575.1 |
| 6,559,803 B2 * | 5/2003 | Shinichi | 343/702 |
| 6,615,026 B1 * | 9/2003 | Wong | 455/575.5 |
| 6,785,519 B2 * | 8/2004 | Toyoda et al. | 455/90.1 |
| 2002/0123312 A1 * | 9/2002 | Hayes et al. | 455/90 |

FOREIGN PATENT DOCUMENTS

| | | | |
|---|---|---|---|
| EP | 0986130 A2 | 3/2000 | H01Q/1/24 |
| EP | 1018779 A2 | 7/2000 | H01Q/9/04 |
| EP | 1132998 A2 | 9/2001 | H01Q/1/24 |
| WO | WO0213306 | 2/2002 | H01Q/1/24 |
| WO | WO0237600 | 5/2002 | H01Q/1/24 |
| WO | WO02063712 | 8/2002 | H01Q/1/24 |
| WO | WO02065582 | 8/2002 | H01Q/9/36 |

OTHER PUBLICATIONS

Patent Abstracts of Japan, Maeda Takeyasu: "Radio Communication Device" Publication No. 09027711, Jan. 28, 1997, Application No. 07176000, Jul. 12, 1995.

Patent Abstracts of Japan, Ito Hirochika: "Antenna System And Portable Radio Equipment" Publication No. 2000101333, Apr. 7, 2000, Application No. 10266478, Sep. 21, 1998.

* cited by examiner

Primary Examiner—Duc M. Nguyen
(74) Attorney, Agent, or Firm—Gregory L. Thorne

(57) ABSTRACT

A capacitively back-coupled wireless terminal (10) comprises a PCB (22) having a ground conductor (24) on one surface. A back coupling capacitor (C) is carried by the ground conductor. An elongate slot (30) is provided in the ground conductor to widen the bandwidth. An electromagnetic shield (32) is provided on the side of the PCB (22) which in use is facing a lossy dielectric in order to reduce the SAR. The shield is disposed adjacent to, but spaced from, the slot (30) in the ground conductor and the back coupling capacitor. For narrowband operation the slot may be omitted and/or the spacing between the PCB (22) and the shield (32) may be reduced.

7 Claims, 3 Drawing Sheets

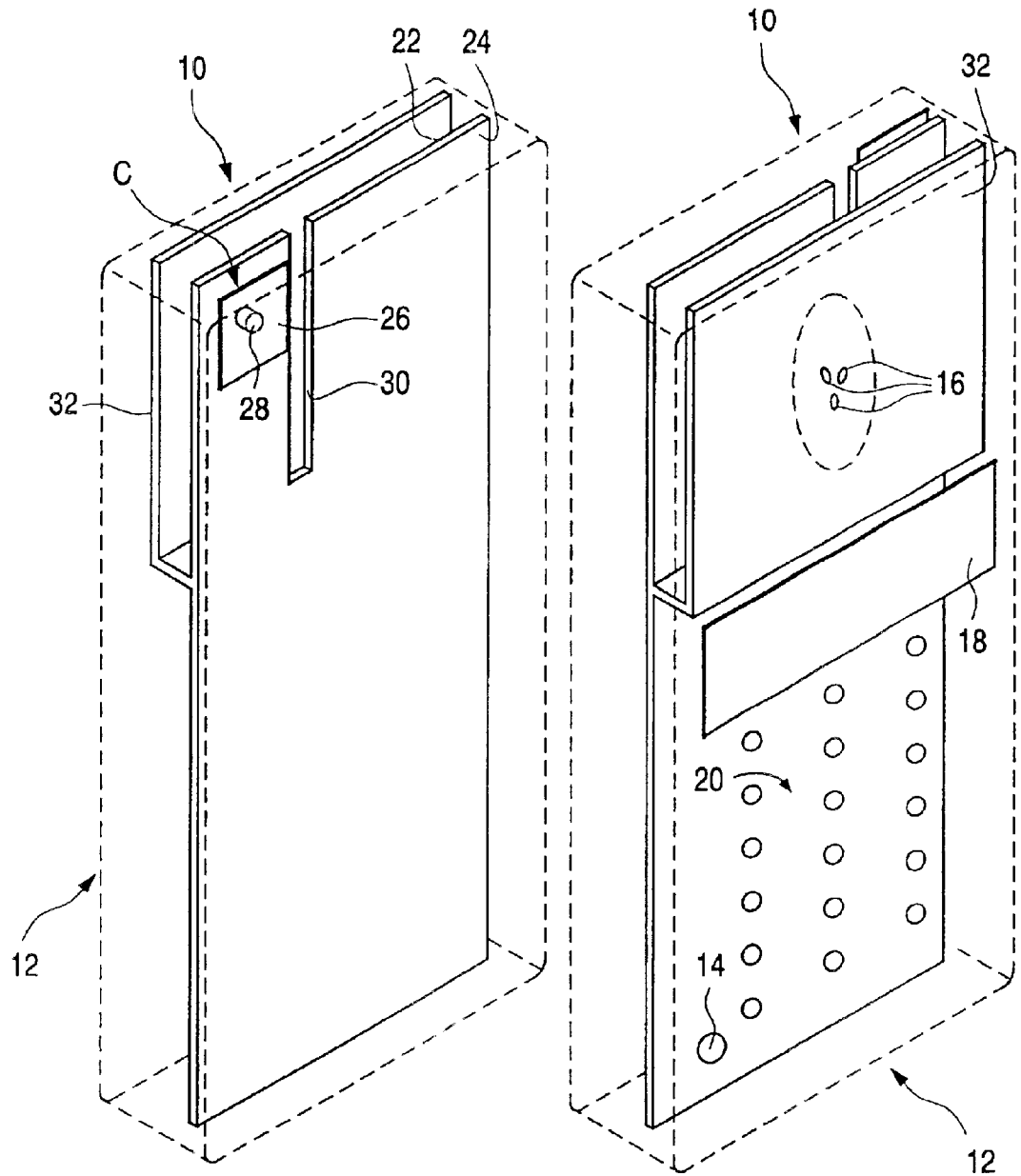

WIRELESS TERMINAL

Figure 3:
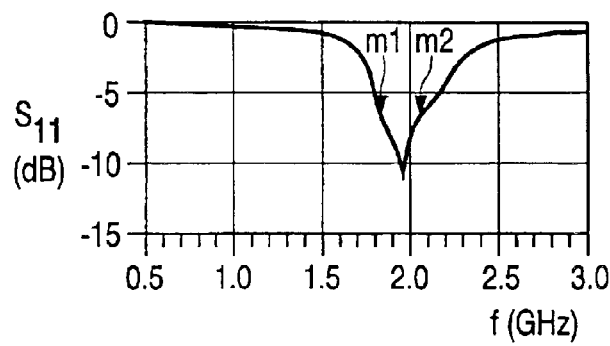

The present invention relates to a wireless terminal having particular, but not exclusive, application as a cellular telephone or low power remote control terminal. More particularly the present invention relates to a wireless terminal having a planar antenna.

Conventionally, planar inverted F antennas (PIFA) or similar are used to provide low SAR (Specific Absorption Rate) performance on handheld terminals such as mobile phones. PIFAs must have a relatively large distance, typically 8 mm, between their top plate and the supporting PCB in order to having sufficient bandwidth for GSM (900 MHz) and DCS (1800 MHz) operation. This limits the thickness of say the mobile phone.

International Patent Application WO 02/13306 (Applicant's reference PHGB 010056WO) discloses a method of widening the bandwidth of a radio communication terminal which uses the handset as a radiator. More specifically in place of an antenna, a physically very small, back coupling capacitor designed to have a large capacitance for maximum coupling and minimum reactance is used. The residual reactance of the back coupling capacitor can be tuned out with a simple matching circuit. With such an arrangement, the bandwidth can be greater than with a conventional antenna and handset combination because the handset acts as a low Q radiator.

The bandwidth can be improved by redesigning the handset case to increase the resistance in the return loss $S_{11}$ after matching. This was simulated using the High Frequency Structure Simulator (HFSS) available from Ansoft Corporation. Experiments have shown that the length of the handset could be optimised to give a wide bandwidth centred on a particular frequency. A transversely extending slot or longitudinally extending slot are means whereby for a fixed length handset, electrical shortening or lengthening can be achieved. Examples of longitudinally extending slots are illustrated in FIGS. 11, 14 and 17 of the cited specification.

It is well known that in simulating the absorption of radiation, the human body resembles a lossy dielectric which absorbs electrical radiation. The local maxima of the body loss is measured by the SAR (Specific Absorption Rate) performance. Losses of radiated energy to the body represent a waste of energy which will needlessly reduce battery life prematurely without enhancing the overall performance of the terminal, An object of the present invention is to improve the SAR of a capacitively back-coupled handset.

According to the present invention there is provided a wireless terminal comprising a printed circuit board having a ground conductor, a back-coupling capacitor mounted on the printed circuit board and including a plate electrode spaced from a surface of the printed circuit board, and a radiation blocking shield spaced from a side of the printed circuit board which in use faces a lossy side of the terminal.

The advantages of providing a shield are that the SAR is improved and that the shield can be placed relatively close to the printed circuit board in the handset which will enable the terminal, for example mobile telephone handset, to be slimmer and thereby more, attractive to users.

An elongate slot may be provided in the ground conductor which will enable the operating frequency bandwidth of the terminal to be widened without the terminal having to be made thicker.

Figure 4:
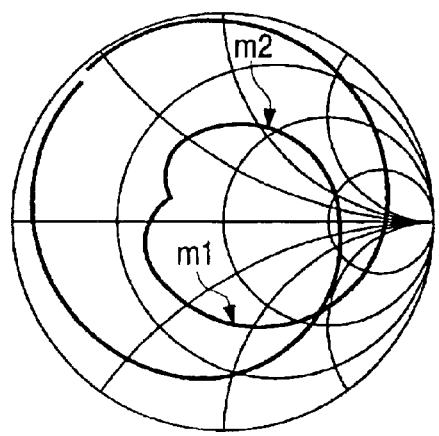
Figure 5:
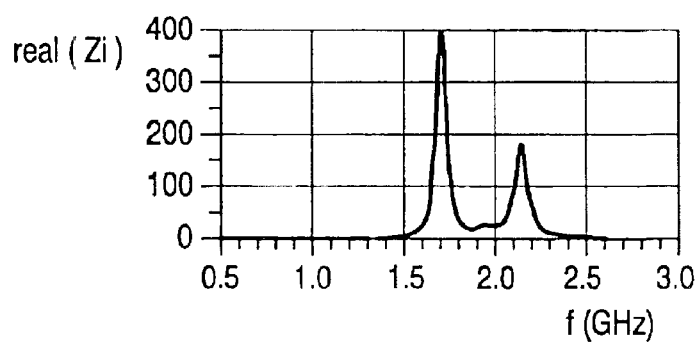
Figure 6:
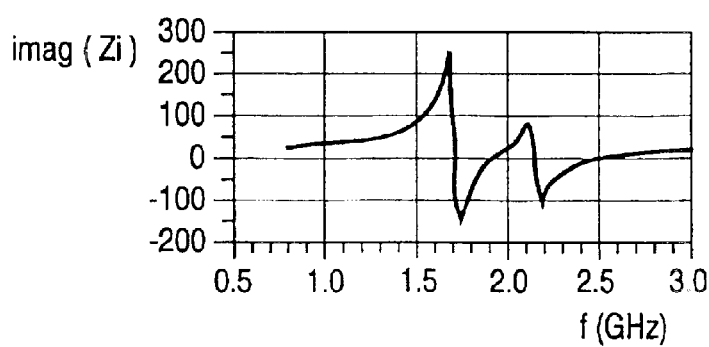
Figure 7:
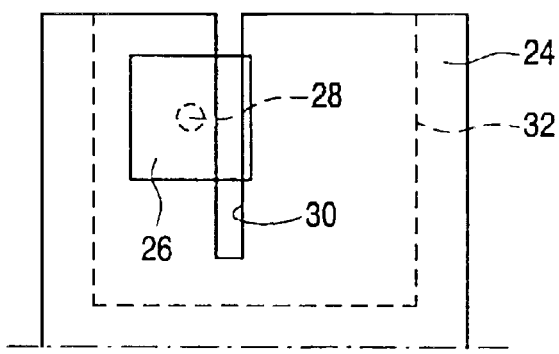
Figure 8:
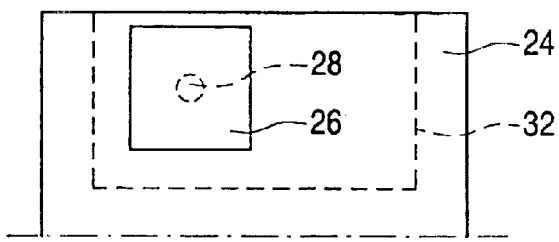
Figure 9:
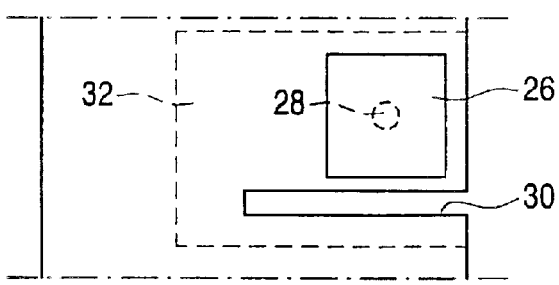
Figure 10:
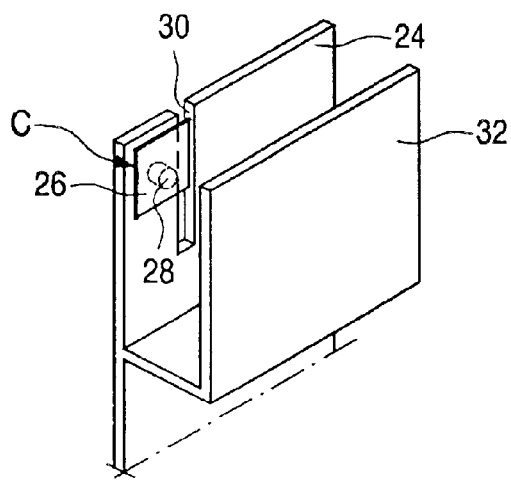

The present invention will now be described, by way of example, with reference to the accompanying drawings, wherein:

FIG. 1 is a diagrammatic perspective view from the back of an embodiment of a portable wireless terminal made in accordance with the present invention, FIG. 2 is a diagrammatic perspective view from the front of an embodiment of a portable wireless terminal made in accordance with the present invention, FIG. 3 is graph of simulated return loss $S_{11}$ in dB against frequency f in GHz for the portable wireless terminal shown in FIGS. 1 and 2, FIG. 4 is a Smith chart showing the simulated impedance of the portable wireless terminal shown in FIGS. 1 and 2 over the frequency range 800.0 MHz to 3.0 GHz, FIGS. 5 and 6 are graphs of real and imaginary parts of the antenna input impedance in ohms against frequency f in GHz, respectively, for the portable wireless terminal shown in FIGS. 1 and 2 having the shield in place, FIG. 7 is a sketch showing a portion of the printed circuit board with the plate of the capacitor covering a portion of the slot, FIG. 8 is a sketch showing a portion of the printed circuit board having the capacitor but no slot, FIG. 9 is a sketch showing a portion of the printed circuit board having the slot extending transversely of the printed circuit board, and FIG. 10 is a sketch showing the capacitor mounted in the space between the printed circuit board and the shield.

In the drawings the same reference numerals have been used to indicate corresponding features.

The embodiment of the wireless terminal shown in FIGS. 1 and 2 comprises a capacitively back-coupled handset 10 suitable for use as a cellular or cordless telephone. The handset 10 has an external plastics housing 12, shown in broken lines, on the front side of which are provided an aperture 14 for access to a microphone (not shown), apertures 16 for access to a loudspeaker (not shown), a LCD panel 18 and a keypad 20.

Within the housing 12 is mounted an elongate printed circuit board 22 carrying on at least one surface electronic components (not shown) required for the control of the handset 10 and for the associated processing of transmitted and received speech and data signals. At least a portion of the other surface of the circuit board 22 facing the back of the handset is metallised to provide a ground plane 24.

The illustrated handset does not have a dedicated, separate antenna but has a physically small back-coupling capacitor C designed to have a large capacitance for maximum coupling and minimum reactance. The residual reactance of the back-coupling capacitor can be tuned out with a simple matching circuit, for example a series inductor followed by a shunt inductor. By correct design of the handset 10, the bandwidth can be much greater than with a conventional antenna and handset combination, because the handset acts as a low Q radiating element (simulations show a typical Q is around 1), whereas conventional antennas typically have a Q of around 50.

The capacitor C comprises a parallel plate capacitor formed by a first plate consisting of a 10 mm×10 mm plate 26 mounted on an insulated support 28 above the corner of the ground plane 24 which constitutes a second plate of the capacitor. The first plate 26 of the capacitor is fed by way of a transmission line (not shown) which extends through the support 28. The resulting capacitance is of the order of 0.5 pF, representing a compromise between capacitance (which would be increased by reducing the separation of the plate 26 and the ground plane 24) and the coupling effectiveness (which depends on the separation of the plate 26 and the ground plane).

In order to increase the bandwidth of the handset 10, a longitudinally extending slot 30 is provided in the circuit board 22. The slot 30 is parallel to the length, or major axis, of the circuit board. The dimensions of the slot 30 are chosen having regard to the desired bandwidth of the handset 10 and for combined GSM and DCS operation, the dimensions may typically be 3 mm wide and 29.5 mm long, the circuit board typically being 100 mm×40 mm×1 mm.

An electrically conductive shield 32 is mounted on, and connected electrically to, the circuit board 22 so as to extend parallel to, but spaced from, the portion of the circuit board in which the slot 30 and the capacitor C are provided. The spacing between the shield 32 and the circuit board 22 is of the order of 4 mm. The depth of the spacing is dependent on factors such as bandwidth. Thus if the spacing is smaller than 4 mm, the bandwidth is narrower. As a consequence a phone for use on a single standard as opposed to two or more standards may be slimmer.

The shield 32 need not extend across the entire width of the circuit board 22 but it should cover the capacitor C and the slot 30. The shield 32 may be mounted in any convenient way such as with screws and spacers or with adhesives.

Simulations of a handset having a shield 32 have shown a significant reduction in the magnetic field strength on the side containing the loudspeaker earpiece, that is, the apertures 16. This in turn leads to a lower SAR and less power loss to the user of the handset. The overall thickness of the handset can be thinner compared to a handset not having a shield.

FIG. 3 illustrates the return loss $S_{11}$ using the High Frequency Structure Simulator (HFSS), available from Ansoft Corporation, with the results shown between 0.5 and 3.0 GHz. The matching network comprised a series inductor of 4 nH followed by a shunt inductor of 4 nH. The 6 dB bandwidth between the frequencies m1 and m2, namely 1.823 and 2.065 Ghz, is approximately 200 MHz and the 3 db bandwidth is significantly wider. Also due to the shape of the $S_{11}$ response with frequency, the bandwidth can be widened with a parallel LC tuned circuit (with an easily realisable, small inductance value. Such a circuit also has a useful filtering function.

The Smith chart shown in FIG. 4 relates to a frequency band of 800.0 MHz to 3.00 GHz and the 6 dB bandwidth is shown between the frequencies m1 and m2, namely 1.823 and 2.065 GHz.

FIGS. 5 and 6 are graphs showing the real and imaginary parts of the antenna input impedance plotted against frequency when the shield is present. These graphs confirm what is shown in the Smith chart.

SAR simulations of the handset embodiment shown in FIGS. 1 and 2 were performed at 1800 MHz with the handset in close proximity to a simple flat phantom, orientated in the same plane as the PCB 22 (i.e. parallel to it). The dielectric constant and conductivity of the phantom were respectively $\epsilon_r=40$ and σ=1.4 S/m. Three sets of results were generated, the first without the shield 32 and with the circuit board 22 spaced from the phantom by 5 mm, the second with the shield 32 present and touching the phantom, and the third with the shield present and spaced from the phantom by 1 mm. The following results were obtained for SAR in W/kg:

| Antenna | Accepted Power (W) | SAR at 1 W accepted power | | |
|---|---|---|---|---|
| | | Peak | 1 gram | 10 gram |
| Unshielded | 0.280 | 73.4 | 37.2 | 18.2 |
| Shielded, touching | 0.284 | 22.8 | 8.56 | 5.03 |
| Shielded, 1 mm spacing | 0.274 | 19.1 | 11.5 | 7.03 |

These results demonstrate that the shield 32 provides a considerable reduction in SAR, typically reducing it to around 30% of the value without a shield. This confirms the reduction in SAR that would be expected from FIGS. 3 to 6.

FIG. 7 is a variant of the embodiment shown in FIGS. 1 and 2 in that the plate 26 of the capacitor C overlaps the slot 30. Also for the sake of illustration the shield, shown in broken lines, does not extend over the entire width of the printed circuit board 32. The width of the shield 32 is independent of the width of the slot 30 and/or the size of the plate 26, as long as the plate 26 is covered.

The embodiment shown in FIG. 8 does not have a slot 30. However a shield 32 is provided and covers the plate 26 of the capacitor. Such an embodiment is suited to narrow bandwidth operation, for example in a terminal operating in accordance with a single standard, such as GSM or DCS.

Although in the embodiments described with reference to FIGS. 1, 2 and 7 the slot 30 in the ground plane has been shown extending longitudinally of the printed circuit board 22, it may extend in other directions, such as transversely of the elongate printed circuit board subject to the orientation of the shield 32 being changed accordingly. This is illustrated in FIG. 9 of the accompanying drawings.

Referring to FIG. 10, this illustrates that the capacitor C can be located on the side of the printed circuit board 22 facing the shield 32.

In all the embodiments of the invention, the dielectric of the capacitor C can be of any suitable type. However it is necessary that one of the electrodes is a plate.

In the present specification and claims the word "a" or "an" preceding an element does not exclude the presence of a plurality of such elements. Further, the word "comprising" does not exclude the presence of other elements or steps than those listed.

From reading the present disclosure, other modifications will be apparent to persons skilled in the art. Such modifications may involve other features which are already known in the design, manufacture and use of capacitively backcoupled wireless terminals and component parts therefor and which may be used instead of or in addition to features already described herein.

What is claimed is:

1. A wireless terminal comprising a printed circuit board having a ground conductor, a back-coupling capacitor mounted on the printed circuit board and including a plate electrode spaced from a surface of the printed circuit board, and a radiation blocking shield spaced from a side of the printed circuit board which in use faces a lossy side of the terminal.

2. A terminal as claimed in claim 1, characterised in that the back-coupling capacitor is a parallel plate capacitor and in that a portion of the ground conductor comprises a second plate electrode.

3. A terminal as claimed in claim 1, characterised in that an elongate slot is provided in the ground conductor and in that the shield is coextensive with at least the entire length of the slot.

4. A terminal as claimed in claim 3, characterised in that the printed circuit board is elongate and the slot is parallel to the major axis of the printed circuit board.

5. A terminal as claimed in claim 1, characterised in that an elongate slot is provided in the ground plane, in that a back-coupling capacitor is positioned adjacent the slot, and in that the shield is mounted adjacent to, but spaced from, the slot and the back-coupling capacitor and covers the slot.

6. A terminal as claimed in claim 1, characterised in that an elongate slot is provided in the ground plane, in that the plate electrode of the back-coupling capacitor is positioned to cover at least part of the slot, and in that the shield is mounted adjacent to, but spaced from, the slot and the back-coupling capacitor and covers the slot.

7. A terminal as claimed in claim 1, characterised by a loudspeaker and in that the shield is juxtaposed behind the loudspeaker to prevent radiation propagating towards the loudspeaker.

* * * * *